(12) United States Patent
Irizarry et al.

(10) Patent No.: US 9,067,261 B2
(45) Date of Patent: *Jun. 30, 2015

(54) PROCESS FOR MAKING SILVER POWDER PARTICLES WITH VERY SMALL SIZE CRYSTALLITES

(75) Inventors: Roberto Irizarry, Raleigh, NC (US); Haixin Yang, Chapel Hill, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 756 days.

This patent is subject to a terminal disclaimer.

(21) Appl. No.: 13/407,950

(22) Filed: Feb. 29, 2012

(65) Prior Publication Data

US 2013/0058826 A1    Mar. 7, 2013

Related U.S. Application Data

(60) Provisional application No. 61/450,263, filed on Mar. 8, 2011.

(51) Int. Cl.
| | | |
|---|---|---|
| *B22F 1/00* | (2006.01) | |
| *B22F 9/24* | (2006.01) | |
| *H01L 31/0224* | (2006.01) | |
| *H01B 1/02* | (2006.01) | |

(52) U.S. Cl.
CPC ............. *B22F 1/0044* (2013.01); *B22F 1/0011* (2013.01); *B22F 9/24* (2013.01); *H01L 31/022425* (2013.01); *H01B 1/02* (2013.01); *Y02E 10/50* (2013.01)

(58) Field of Classification Search
CPC ......... B22F 1/0044; B22F 9/24; B22F 1/0011
USPC ............................................................. 419/62
IPC ............................. B22F 9/24, 1/0044, 2301/255
See application file for complete search history.

(56) References Cited

U.S. PATENT DOCUMENTS

| | | | |
|---|---|---|---|
| 5,389,122 | A | 2/1995 | Glicksman |
| 7,648,557 | B2 | 1/2010 | Irizarry-Rivera et al. |
| 8,715,387 | B2 * | 5/2014 | Irizarry et al. .................. 75/371 |
| 2010/0276647 | A1 | 11/2010 | Irizarry |
| 2010/0279116 | A1 | 11/2010 | Irizarry |

FOREIGN PATENT DOCUMENTS

| | | |
|---|---|---|
| JP | 2006-225760 A | 8/2006 |
| JP | 04301247 B | 5/2009 |
| WO | 2007/143125 A2 | 12/2007 |

OTHER PUBLICATIONS

U.S. Appl. No. 12/770,902, filed Apr. 30, 2010, Irizarry et al.
U.S. Appl. No. 12/871,167, filed Aug. 30, 2010, Irizarry.
U.S. Appl. No. 12/948,098, filed Nov. 17, 2010, Irizarry et al.

* cited by examiner

*Primary Examiner* — Weiping Zhu

(57) ABSTRACT

The process for making silver powder particles with very small size crystallites uses a combination of gum arabic and maleic acid with the reduction of a silver salt with ascorbic acid. Silver thick film paste containing these silver powder particles can be used in electronic applications to form electrodes for semiconductor devices and, in particular, solar cells.

14 Claims, 1 Drawing Sheet

PROCESS FOR MAKING SILVER POWDER PARTICLES WITH VERY SMALL SIZE CRYSTALLITES

FIELD OF THE INVENTION

The invention is directed to a process for making silver powder particles with very small size crystallites. These silver powder particles are particularly useful in electronic applications.

BACKGROUND OF THE INVENTION

Silver powder is used in the electronics industry for the manufacture of conductor thick film pastes. The thick film pastes are screen printed onto substrates forming conductive circuit patterns. These circuits are then dried and fired to volatilize the liquid organic vehicle and sinter the silver particles.

Many processs currently used to manufacture metal powders can be applied to the production of silver powders. For example, thermal decomposition processes, electrochemical processes, physical processes such as atomization or milling and chemical reduction processs can be used. Thermal decomposition processes tend to produce powders that are spongy, agglomerated, and very porous whereas electrochemical processes produce powders that are crystalline in shape and very large. Physical processes are generally used to make flaked materials or very large spherical particles. Chemical precipitation processes produce silver powders with a range of sizes and shapes.

Silver powders used in electronic applications are generally manufactured using chemical precipitation processes. Silver powder is produced by chemical reduction in which an aqueous solution of a soluble salt of silver is reacted with an appropriate reducing agent under conditions such that silver powder can be precipitated. Inorganic reducing agents including hydrazine, sulfite salts and formate salts can produce powders which are very coarse in size, are irregularly shaped and have a large particle size distribution due to aggregation. Organic reducing agents such as alcohols, sugars or aldehydes are used with alkali hydroxides to reduce silver nitrate. The reduction reaction is very fast; hard to control and produces a powder contaminated with residual alkali ions. Although small in size (<1 µm), these powders tend to have an irregular shape with a wide distribution of particle sizes that do not pack well. It is difficult to control the sintering of these types of silver powders and they do not provide adequate line resolution in thick film conductor circuits.

Therefore, there is a need for a process to produce silver powder spherical particles comprising very small size crystallites and having a $d_{50}$ paricle size in the range of 0.5 to 3.5 µm to provide silver thick film paste with improved sintering properties.

SUMMARY OF THE INVENTION

This invention provides a process for making silver powder particles, the process comprising:
(a) preparing an acidic aqueous silver salt solution comprising a water soluble silver salt dissolved in deionized water;
(b) preparing an acidic aqueous reducing and particle modifier solution comprising:
  (i) a reducing agent selected from the group consisting of ascorbic acid, ascorbates and mixtures;
  (ii) nitric acid;
  (iii) maleic acid; and
  (iv) deionized water, wherein the pH of the acidic aqueous reducing and particle modifier solution is adjusted by the addition of a base to between 2.5 and 6;
(c) maintaining the acidic aqueous silver salt solution and the acidic reducing and surface morphology modifier solution at the same temperature, wherein the temperature is in the range of 10° C. to 65° C., while stirring each the solution during and after preparation;
(d) adding the acidic aqueous silver salt solution to the acidic aqueous reducing and particle modifier solution while stirring to make a reaction mixture and maintaining the temperature of the reaction mixture at the temperature of (c), wherein the silver powder particles precipitate and are contained within the resulting final aqueous solution; and
(e) increasing the temperature of the final aqueous solution to a temperature in the range of 65° C. to 80° C. while continuing stirring;
one or both of the acidic aqueous silver salt solution and the acidic aqueous reducing and particle modifier solution further comprising gum arabic and the silver powder particles comprising crystallites of size less than or equal to 32 nm as determined by X-ray diffraction and the Scherrer formula; and the silver powder particles having a $d_{50}$ in the range of 0.5 to 3.5 µm.

Also provided is the above process further comprising:
(f) separating the silver powder particles from the final aqueous solution;
(g) washing the silver powder particles with deionized water; and
(h) drying the silver powder particles.

Also provided are the silver powder particles made by the above process, silver thick film paste made with the silver powder particles and a semiconductor device comprising an electrode that prior to firing comprises the silver thick film paste.

DETAILED DESCRIPTION OF THE INVENTION

Figure 1:
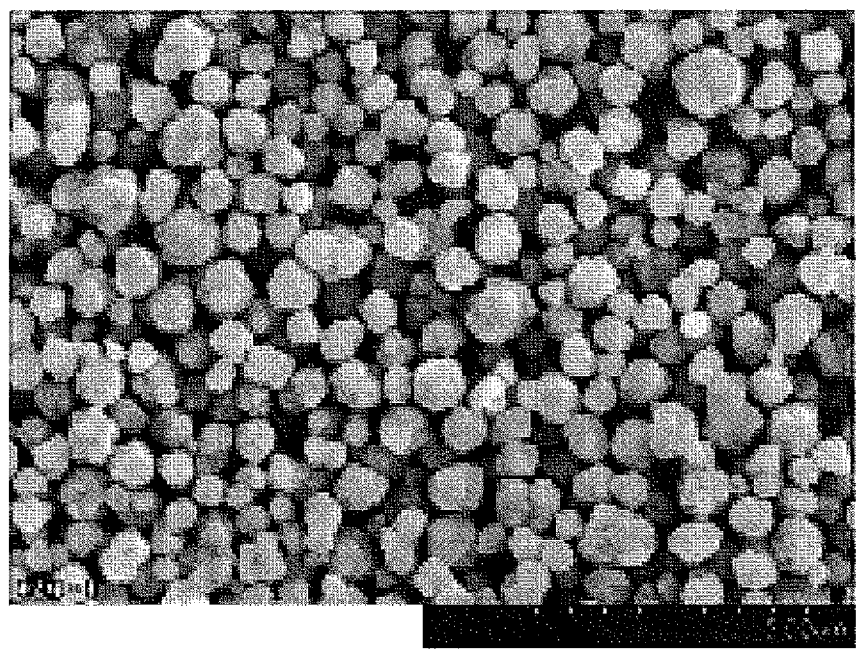
FIG. 1 is a scanning electron microscope image at a magnification of 10,000 of the silver powder particles made in the Example. The $d_{50}$ particle size is 1.6 µm.

This invention provides a process for making spherically-shaped silver powder particles with very small size crystallites. A combination of gum arabic and maleic acid is used with the reduction of a silver salt with ascorbic acid to control the crystallite size. The process is a reductive process in which silver particles comprising crystallites less than 30 nm in size as determined by X-ray diffraction and the Scherrer formula are precipitated by adding together an acidic aqueous solution of a water soluble silver salt and an acidic aqueous reducing and particle modifier solution containing a reducing agent, nitric acid, gum arabic, and maleic acid. In addition, the pH of the acidic aqueous reducing and particle modifier solution is adjusted to between 2.5 and 6 by the addition of a base, preferably NaOH. In one group of embodiments the pH of the acidic aqueous reducing and particle modifier solution is adjusted to between 3 and 5 and in another group of embodiments the pH is adjusted to 4.

The acidic aqueous silver salt solution is prepared by adding a water soluble silver salt to deionized water. Any water soluble silver salt, e.g., silver nitrate, silver phosphate, and silver sulfate, can be used. Silver nitrate is preferred. No complexing agents are used which could provide side reactions that affect the reduction and type of particles produced. Nitric acid can be added to increase the acidity.

The process can be run at concentrations up to 1.2 moles of silver per liter of final aqueous solution. It is preferred to run the process at concentrations of 0.47 to 0.8 moles of silver per liter of final aqueous solution. These relatively high concentrations of silver make the manufacturing process cost effective.

The acidic aqueous reducing and particle modifier solution is prepared by adding the various components, i.e., a reducing agent, maleic acid and nitric acid, to deionized water. Suitable reducing agents for the process are ascorbic acids such L-ascorbic acid and D-ascorbic acid and related ascorbates such as sodium ascorbate. Ascorbic acid is preferred.

One or both of the acidic aqueous silver salt solution and the acidic aqueous reducing and particle modifier solution further contain gum arabic.

In one embodiment, the acidic aqueous reducing and particle modifier solution also contains a metal colloid selected from the group consisting of gold colloid and silver colloid. A suitable metal colloid is gold colloid or silver colloid. Gold colloid is preferred.

The components can be added to the deionized water in various orders. In one embodiment, gum arabic is the first component added to the deionized water whether it is in the preparation of the acidic aqueous silver salt solution or the acidic aqueous reducing and particle modifier solution. The gum arabic is added to the deionized water and then stirred for a period of time before adding the other components. In the Examples, for the acidic aqueous silver salt solution 10 g of gum arabic was added to 125 g or 250 g of deionized water and for the acidic aqueous reducing and particle modifier solution 14 g of gum arabic was added to 375 g of deionized water and the mixture stirred for an hour before adding any other component. Times for stirring smaller or larger quantities could be adjusted accordingly. In this embodiment nitric acid acid, maleic acid, ascorbic acid and gold colloid solution are added in that order to form the acidic aqueous reducing and particle modifier solution. Stirring for a time as indicated above should occur following addition of the gum arabic no matter the order of adding the components.

The order of preparing the acidic aqueous silver salt solution and the acidic reducing and particle modifier solution is not important. The acidic aqueous silver salt solution can be prepared before, after, or contemporaneously with the acidic reducing and particle modifier solution. The acidic aqueous silver salt solution is added to the acidic reducing and particle modifier solution. The addition is carried out slowly. For example, with the quantities of solutions used in the Examples, i.e., 125 and 250 g of deionized water for the acidic aqueous silver salt solution and 375 and 750 g of deionized water for the acidic aqueous reducing and particle modifier solution, the acidic aqueous silver salt solution was added to the acidic reducing and particle modifier solution over a period of one hour. Smaller quantities could be mixed over a shorter time interval and larger quantites over a longer time period. The reaction mixture is stirred during the addition.

In this process the acidic aqueous silver salt solution and the acidic aqueous reducing and particle modifier solution are both maintained at the same temperature, i.e., a temperature in the range of 10° C. to 65° C. and each solution is stirred until they are mixed. In some emdodiments the solutions are maintained at a temperature in the range of 10° C. to 35° C. In one such embodiment the solutions are maintained at 25° C. When the two solutions are mixed to form the reaction mixture, the reaction mixture is maintained at that same temperature.

The mixture of the acidic aqueous silver salt solution and the acidic reducing and particle modifier solution results in the precipitation of the silver particles that are contained within the resulting final aqueous solution. Following precipitation, the temperature of the final aqueous solution is heated to a temperature in the range of 65° C. to 80° C. In some embodiments the a temperature is in the range of 65° C. to 75° C. In one such embodiment the temperature is 70° C. The final aqueous solution containing the silver particles is maintained at this temperature for about an hour and is stirred during that time.

The silver particles are then separated from the final aqueous solution by filtration or other suitable liquid-solid separation operation and the solids are washed with deionized water until the conductivity of the wash water is 100 microSiemans or less. The silver particles are then dried.

The silver powder particles made by the process of the invention have a particular set of physical characteristics. The silver particles are described herein as spherically-shaped. It can be seen from the scanning electron microscope (SEM) image of FIG. 1 that the particles are generally spherical in shape but are not perfect spheres. The average particle size determined from the SEM image is in the range of 1 to 2.5 μm. The silver powder particles are comprised of crystallites less than or equal to 32 nm in size as determined by X-ray diffraction and the Scherrer formula. In one group of embodiments the crystallites are less than or equal to 30 nm in size. The silver powder particles have a $d_{50}$ in the range of 0.5 to 3.5 μm and a size distribution such that $(d_{90}-d_{10})/d_{50}<2.2$. The quantity $(d_{90}-d_{10})/d_{50}$ is a measure of the size distribution of the particles. Since $(d_{90}-d_{10})/d_{50}<2.2$, it indicates the narrow size distribution of the particles, i.e., the uniformity of particle size and the correspondly highly dispersible nature of the silver powders comprising these particles. The silver particles have a solids content of in excess of 99% as determined by thermogravimetric analysis. Thermomechanical analysis (TMA) is used herein as an indicator of sinterabilty. A pellet was formed from the silver particles and subjected to a temperature regime. The observed per cent shrinkage, i.e., the dimensional change of the pellet, is a measure of the sinterability of the particles. The results are presented herein as TMA equal to the percent dimensional change, a negative per cent change since it represents a shrinkage. The silver particles of the invention showed TMA dimensional changes, i.e., shrinkages, of at least −10%.

The silver powder particles made by this invention can be used in thick film paste applications, including thick films for front side metallization of photovoltaic solar cells and thick films for other semiconductor devices.

This invention also provides the silver powder particles made by the process of this invention. These silver powder particles can be used in thick film paste. The structure of these silver particles will lend them to be more readily sintered and provide improved thick film conductors. Also provided is a semiconductor device, e.g., a solar cell, comprising an electrode that prior to firing comprises the silver thick film paste.

Silver Thick Film Paste

This invention also provides a silver thick film paste comprised of the silver powder particles made by the process of this invention and glass frit dispersed in an organic medium. As used herein, "thick film paste" refers to a composition which after being deposited on a substrate and fired has a thickness of 1 to 100 μm.

The glass frit compositions are described herein as including percentages of certain components. The percentages are the percentages of the components used in the starting material that was subsequently processed as described herein to form a glass composition. The composition contains certain components and the percentages of those components are expressed as a percentage of the corresponding oxide or fluoride form. The weight percentages of the glass frit components are based on the total weight of the glass composition. A certain portion of volatile species may be released during the process of making the glass. An example of a volatile species is oxygen.

Various glass frit compositions are useful in the silver thick film pastes of the invention. The glass frit used has a softening point of 300 to 600° C. The glass frit compositions described herein are not limiting. Minor substitutions of additional ingredients can be made without substantially changing the desired properties of the glass composition. For example, substitutions of glass formers such as 0-3 wt % $P_2O_5$, 0-3 wt % $GeO_2$ and 0-3 wt % $V_2O_5$ can be used either individually or in combination to achieve similar performance.

The glass frit compositions can also contain one or more fluorines-containing components such as salts of fluorine, fluorides and metal oxyfluoride compounds. Such fluorine-containing components include, but are not limited to $BiF_3$, $AlF_3$, NaF, LiF, KF, CsF, $PbF_2$, $ZrF_4$, $TiF_4$ and $ZnF_2$.

Exemplary lead free glass compositions contain one or more of $SiO_2$, $B_2O_3$, $Al_2O_3$, $Bi_2O_3$, $BiF_3$, ZnO, $ZrO_2$, CuO, $Na_2O$, NaF, $Li_2O$, LiF, $K_2O$, and KF. In various embodiments the compositions comprise the following oxide constituents in the compositional ranges, the $SiO_2$ is 17 to 26 wt %, 19 to 24 wt %, or 20 to 22 wt %; the $B_2O_3$ is 2 to 9 wt %, 3 to 7 wt %; or 3 to 4 wt %; the $Al_2O_3$ is 0.1 to 5 wt %, 0.2 to 2.5 wt %, or 0.2 to 0.3 wt %; the $Bi_2O_3$ is 0 to 65 wt %, 25 to 64 wt %, or 46 to 64 wt %; the $BiF_3$ is 0 to 67 wt %, 0 to 43 wt %, or 0 to 19 wt %; the $ZrO_2$ is 0 to 5 wt %, 2 to 5 wt %, or 4 to 5 wt %; the $TiO_2$ is 1 to 7 wt %, 1 to 5 wt %, or 1 to 3 wt %; CuO is 0 to 3 wt % or 2 to 3 wt %; $Na_2O$ is 0 to 2 wt % or 1 to 2 wt %; NaF is 0 to 3 wt % or 2 to 3 wt %; $Li_2O$ is 0 to 2 wt % or 1 to 2 wt %; and LiF is 0 to 3 wt % or 2 to 3 wt %. Some or all of the $Na_2O$ or $Li_2O$ can be replaced with $K_2O$ and some or all of the NaF or LiF can be replaced with KF to create a glass with properties similar to the compositions listed above.

In other embodiments, the glass frit compositions can include one or more of a third set of components: $CeO_2$, $SnO_2$, $Ga_2O_3$, $In_2O_3$, NiO, $MoO_3$, $WO_3$, $Y_2O_3$, $La_2O_3$, $Nd_2O_3$, FeO, $HfO_2$, $Cr_2O_3$, CdO, $Nb_2O_5$, $Ag_2O$, $Sb_2O_3$, and metal halides (e.g. NaCl, KBr, NaI).

Exemplary lead containing glass compositions comprise the following oxide constituents in the compositional range of 0-36 wt % $SiO_2$, 0-9 wt % $Al_2O_3$, 0-19 wt % $B_2O_3$, 16-84 wt % PbO, 0-4 wt % CuO, 0-24 wt % ZnO, 0-52 wt % $Bi_2O_3$, 0-8 wt % $ZrO_2$, 0-20 wt % $TiO_2$, 0-5 wt % $P_2O_5$, and 3-34 wt % $PbF_2$. In other embodiments relating to glasses containing bismuth oxide, the glass frit composition contains 4-26 wt % $SiO_2$, 0-1 wt % $Al_2O_3$, 0-8 wt % $B_2O_3$, 20-52 wt % PbO, 0-4 wt % ZnO, 6-52 wt % $Bi_2O_3$, 2-7 wt % $TiO_2$, 5-29 wt % $PbF_2$, 0-1 wt % $Na_2O$ and 0-1 wt % $Li_2O$. In still other embodiments relating to glasses containing 15-25 wt % ZnO, the glass frit comprises 5-36 wt % $SiO_2$, 0-9 wt % $Al_2O_3$, 0-19 wt % $B_2O_3$, 17-64 wt % PbO, 0-39 wt % $Bi_2O_3$, 0-6 wt % $TiO_2$, 0-5 wt % $P_2O_5$ and 6-29 wt % $PbF_2$. In various of these embodiments containing ZnO, the glass frit compositions comprises 5-15 wt % $SiO_2$ and/or 20-29 wt % $PbF_2$ and/or 0-3 wt % $ZrO_2$ or 0.1-2.5 wt % $ZrO_2$. Embodiments containing copper oxide and/or alkali modifiers comprise 25-35 wt % $SiO_2$, 0-4 wt % $Al_2O_3$, 3-19 wt % $B_2O_3$, 17-52 wt % PbO, 0-12 wt % ZnO, 0-7 wt % $Bi_2O_3$, 0-5 wt % $TiO_2$, 7-22 wt % $PbF_2$, 0-3 wt % CuO, 0-4 wt % $Na_2O$ and 0-1 wt % $Li_2O$.

An exemplary method for producing the glass frits described herein is by conventional glass making techniques. Ingredients are weighed then mixed in the desired proportions and heated in a furnace to form a melt in platinum alloy crucibles or other suitable metal or ceramic crucibles. As indicated above, oxides as well as fluoride or oxyfluoride salts can be used as raw materials. Alternatively, salts, such as nitrate, nitrites, carbonate, or hydrates, which decompose into oxide, fluorides, or oxyfluorides at temperature below the glass melting temperature can be used as raw materials. Heating is conducted to a peak temperature of typically 800-1400° C. and for a time such that the melt becomes entirely liquid, homogeneous, and free of any residual decomposition products of the raw materials. The molten glass is then quenched between counter rotating stainless steel rollers to form a 10-15 mil thick platelet of glass. The resulting glass platelet was then milled to form a glass frit powder with its 50% volume distribution set between to a desired target (e.g. 0.8-1.5 μm). Alternative synthesis techniques such as water quenching, sol-gel, spray pyrolysis, or others appropriate for making powder forms of glass can be employed.

The organic meduium used in the silver thick film paste is a solution of a polymer in a solvent. The organic medium can also contain thickeners, stabilizers, surfactants and/or other common additives. In one embodiment, the polymer is ethyl cellulose. Other exemplary polymers include ethylhydroxyethyl cellulose, wood rosin, mixtures of ethyl cellulose and phenolic resins, polymethacrylates of lower alcohols, and monobutyl ether of ethylene glycol monoacetate, or mixtures thereof. The solvents useful in the organic medium of the silver thick film paste compositions include ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. The organic medium can also contain volatile liquids for promoting rapid hardening after application on the substrate.

The thick film silver composition is adjusted to a predetermined, screen-printable viscosity with the organic medium.

The inorganic components, i.e., the silver powder particles and the glass frit are typically mixed with the organic medium by mechanical mixing to form a viscous paste composition.

The ratio of organic medium in the silver thick film paste composition to the inorganic components in the dispersion is dependent on the method of applying the paste and the kind of organic medium used, and it can vary. The dispersion will typically contain 70 to 95 wt % of inorganic components and 5 to 30 wt % of organic medium in order to obtain good wetting. The weight percents (wt %) used herein are based on the total weight of the silver thick film paste composition. Typically, the polymer present in the organic medium is in the range range of 8 wt % to 11 wt % of the weight of the total composition.

In one embodiment, the silver thick film paste contains 65 to 90 wt % silver powder, 0.1 to 8 wt % glass frit and 5 to 30 wt % organic medium. In another embodiment the silver thick film paste contains 70 to 85 wt % silver powder, 1 to 6 wt % glass frit and 10 to 25 wt % organic medium. In still another embodiment the silver thick film paste contains 78 to 83 wt % silver powder, 2 to 5 wt % glass frit and 13 to 20 wt % organic medium.

Semiconductor Device; Solar Cell

The invention also provides a method of making a semiconductor device, e.g., a solar cell or a photodiode. The semiconductor device has an electrode, e.g., a front side electrode of a solar cell or a photodiode, wherein prior to firing the electrode is comprised of a silver thick film paste of the invention.

The method of manufacturing a semiconductor device, comprises the steps of:
(a) providing a semiconductor substrate, one or more insulating films, and the silver thick film paste of the invention;
(b) applying the insulating film to the semiconductor substrate,
(c) applying the silver thick film paste to the insulating film on the semiconductor substrate, and
(d) firing the semiconductor substrate, the insulating film and the silver thick film paste composition.

Exemplary semiconductor substrates useful in the methods and devices described herein include, but are not limited to, single-crystal silicon, multicrystalline silicon, and ribbon silicon. The semiconductor substrate may be doped with phosphorus and boron to form a p/n junction.

The semiconductor substrates can vary in size (length x width) and thickness. As an example, the thickness of the semiconductor substrate is 50 to 500 µm; 100 to 300 µm; or 140 to 200 µm. The length and width of the semiconductor substrate are each 100 to 250 mm; 125 to 200 mm; or 125 to 156 mm.

Typically an anti-reflection coating is formed on the front side of a solar cell. Exemplary anti-refection coating materials useful in the methods and devices described herein include, but are not limited to: silicon nitride, silicon oxide, titanium oxide, $SiN_x$:H, hydrogenated amorphous silicon nitride, and silicon oxide/titanium oxide film. The coating can be formed by plasma enhanced chemical vapor deposition (PECVD), CVD, and/or other known techniques known. In an embodiment in which the coating is silicon nitride, the silicon nitride film can be formed by PECVD, thermal CVD, or physical vapor deposition (PVD). In an embodiment in which the insulating film is silicon oxide, the silicon oxide film can be formed by thermal oxidation, thermal CVD, plasma CVD, or PVD.

The silver thick film paste of the invention can be applied to the anti-reflective coated semiconductor substrate by a variety of methods such as screen-printing, ink-jet printing, coextrusion, syringe dispensing, direct writing, and aerosol ink jet printing. The paste can be applied in a pattern and in a predetermined shape and at a predetermined position. In one embodiment, the paste is used to form both the conductive fingers and busbars of the front-side electrode. In such an embodiment, the width of the lines of the conductive fingers are 20 to 200 µm, 40 to 150 µm, or 60 to 100 µm and the thickness of the lines of the conductive fingers are 5 to 50 µm, 10 to 35 µm, or 15 to 30 µm.

The paste coated on the ARC-coated semiconductor substrate can be dried, for example, for 0.5 to 10 minutes during which time the volatile solvents and organics of the organic medium are removed.

The dried paste is fired by heating to a maximum temperature of between 500 and 940° C. for a duration of 1 second to 2 minutes. In one embodiment, the maximum silicon wafer temperature reached during firing ranges from 650 to 80° C. for a duration of 1 to 10 seconds. In a further embodiment, the electrode formed from the silver thick film paste is fired in an atmosphere composed of a mixed gas of oxygen and nitrogen. In
another embodiment, the electrode formed from the conductive thick film paste is fired above the organic medium removal temperature in an inert atmosphere not containing oxygen. This firing process removes any remaining organic medium and sinters the glass frit with the silver powder and any metal oxide present to form an electrode. Typically, the burnout and firing is carried out in a belt furnace. The temperature range in the burnout zone, during which time the remaining organic medium is removed, is between 500 and 700° C. The temperature in the firing zone is between 860 and 940° C.

During firing, the fired electrode, preferably the fingers, reacts with and penetrates the anti-reflective oating, thereby making electrical contact with the silicon substrate.

In a further embodiment, prior to firing, other conductive and device enhancing materials are applied to the back side of the semiconductor device and cofired or sequentially fired with the paste compositions of the invention. The materials serve as electrical contacts, passivating layers, and solderable tabbing areas.

In one embodiment, the back side conductive material contains aluminum or aluminum and silver.

In a still further embodiment the materials applied to the opposite type region of the device are adjacent to the materials described herein due to the p and n region being formed side by side. Such devices place all metal contact materials on the non illuminated back side of the device to maximize incident lignt on the illuminated front side.

Measurements

The particle size distribution numbers ($d_{10}$, $d_{50}$, $d_{90}$) used herein are based on a volume (mass) distribution. The particle sizes were measured using a Microtrac® Particle Size Analyzer from Leeds and Northrup. The $d_{10}$, $d_{50}$ and $d_{90}$ are the equivalent diameters that represent the 10th percentile, the median or 50th percentile and the 90th percentile of the particle sizes, respectively, as measured by volume. That is, the $d_{50}$ ($d_{10}$, $d_{90}$) is a value on the distribution such that 50 volume % (10 volume %, 90 volum %) of the particles have an equivalent diameter of this value or less.

The solids content of the silver particles was determined by thermogravimetric analysis, i.e., by a weight loss method after heating at 850° C. for 10 minutes.

The size of the crystallites making up the silver powder particles was determined by X-ray diffraction and the Scherrer formula. The X-ray diffractometer used was a Rigaku Rint RAD-rb. The Cu target provided awavelength of 0.15405 nm. The Bragg plane was the (111). In the Scherrer formula:

$$L(111) = 0.94\lambda/(\beta \cos \theta),$$

L is the crystallite size, $\lambda$ is the wavelength, $\beta$ is the line broadening at half the peak maximum intensity (full width–half maximum) in radians and $\theta$ is the Bragg angle.

The TMA was carried out as follows. A pellet was formed by pouring 0.9-1.1 g of silver powder into a die and onto a cylindrical metal insert serving as the bottom. A second cylindrical metal is inserted into the die on top of the silver powder so that the powder is sandwiched between the the cylindrical metal inserts. The top insert is then firmly tapped 6 times with a mallet. The pellet is placed in a Bargal TMA:Q400 analyzer which measured the dimensional change as a function of temperature. The temperature was raised from room temperature at a rate of 10° C./min to 650° C. and the pellet is maintained at that temperature for 10 minutes. The final per cent dimensional change is reported as the TMA for that powder pellet. A negative value indicates shrinkage and a positive value expansion of the pellet.

EXAMPLES

The following Examples and discussion are offered to further illustrate, but not limit the process of this invention.

Example 1

The acidic aqueous silver salt solution was prepared by adding 10 g of gum arabic to 250 g of deionized water. This solution was kept at 25° C. while continuously stirring for an hour. 80 g of silver nitrate was then added. This solution was kept at 25° C. while continuously stirring.

The acidic reducing and particle modifier solution was prepared by adding 5 g of nitric acid (70% w/w), 5 g maleic acid, 45 g ascorbic acid and 1 g of gold colloid solution to 750 g of deionized water in a separate container from the acidic aqueous silver salt solution. The pH was then adjusted to 4 by adding NaOH. This solution was kept at 25° C. while continuously stirring.

The acidic aqueous silver salt solution was slowly added to the acidic reducing and particle modifier solution over a period of one hour to form a reaction mixture that was intensely stirred during the addition. The reaction mixture was maintained at 25° C. Silver particles precipitated and were contained within the final aqueous solution. The final aqueous solution was then heated to 70° C. for one hour and stirring continued during the heating.

The final aqueous solution was filtered and the silver powder collected. The silver powder was washed with deionized water until a conductivity of the wash water was less than or equal to 100 microSiemans. The silver powder was dried for 24 hours at 35° C. in a freeze dryer.

As shown in the scanning electron microscope image of FIG. 1, the silver powder was comprised of spherically-shaped silver particles. The size L of the crystallites in the particles was 27.1 nm. $d_{10}$, $d_{50}$, and $d_{90}$ were 0.6 mm, 1.6 mm and 3.7 mm, respectively. The silver particles were 99.6% solids. The TMA=−18.

Example 2

The acidic aqueous silver salt solution was prepared by adding 10 g of gum arabic to 125 g of deionized water. This solution was kept at 25° C. while continuously stirring for an hour. 80 g of silver nitrate was then added. This solution was kept at 25° C. while continuously stirring.

The acidic reducing and particle modifier solution was prepared by adding 14 g of gum arabic to 375 g of deionized water in a separate container from the silver salt solution. This solution was kept at 25° C. while continuously stirring for an hour. 3 g of nitric acid (70% w/w), 5 g maleic acid, 45 g ascorbic acid and 1 g of gold colloid solution was then added to the reducing and particle modifier solution. The pH was then adjusted to 4 by adding NaOH. This solution was kept at 25° C. while continuously stirring.

The acidic aqueous silver salt solution was slowly added to the acidic reducing and particle modifier solution over a period of one hour to form a reaction mixture that was intensely stirred during the addition. The reaction mixture was maintained at 25° C. Silver particles precipitated and were contained within the final aqueous solution. The final aqueous solution was then heated to 70° C. for one hour and stirring continued during the heating.

The final aqueous solution was filtered and the silver powder collected. The silver powder was washed with deionized water until a conductivity of the wash water was less than or equal to 100 microSiemans. The silver powder was dried for 24 hours at 35° C. in a freeze dryer.

The size L of the crystallites in the particles was 30.2 nm. $d_{10}$, $d_{50}$, and $d_{90}$ were 0.5 mm, 1.0 mm and 2.0 mm, respectively. The silver particles were 99.6% solids. The TMA=−17.

Example 3

The acidic aqueous silver salt solution was prepared by adding 10 g of gum arabic to 125 g of deionized water. This solution was kept at 25° C. while continuously stirring for an hour. 80 g of silver nitrate was then added. This solution was kept at 25° C. while continuously stirring.

The acidic reducing and particle modifier solution was prepared by adding 14 g of gum arabic to 375 g of deionized water in a separate container from the silver salt solution. This solution was kept at 25° C. while continuously stirring for an hour. 3 g of nitric acid (70% w/w), 1 g maleic acid, 45 g ascorbic acid and 1 g of gold colloid solution was then added to the reducing and particle modifier solution. The pH was then adjusted to 4 by adding NaOH. This solution was kept at 25° C. while continuously stirring.

The acidic aqueous silver salt solution was slowly added to the acidic reducing and particle modifier solution over a period of one hour to form a reaction mixture that was intensely stirred during the addition. The reaction mixture was maintained at 25° C. Silver particles precipitated and were contained within the final aqueous solution. The final aqueous solution was then heated to 70° C. for one hour and stirring continued during the heating.

The final aqueous solution was filtered and the silver powder collected. The silver powder was washed with deionized water until a conductivity of the wash water was less than or equal to 100 microSiemans. The silver powder was dried for 24 hours at 35° C. in a freeze dryer.

The size L of the crystallites in the particles was 26.2 nm. $d_{10}$, $d_{50}$, and $d_{90}$ were 0.3 mm, 0.7 mm and 1.8 mm, respectively. The silver particles were 99.6% solids. The TMA=−17.

Comparative Experiment

An acidic aqueous silver salt solution was prepared by adding 14 g of gum arabic to 250 g of deionized water. This solution was kept at 25° C. while continuously stirring for an hour. Then 80 g of silver nitrate was added. This solution was kept at 25° C. while continuously stirring.

An acidic reducing and particle modifier solution was prepared by adding 5 g of nitric acid (70% w/w), 5 g maleic acid, 45 g ascorbic acid and 1 g of gold colloid solution to 750 g of deionized water in a separate container from the silver nitrate solution. This solution was kept at 25° C. while continuously stirring. The pH was not adjusted to between 3 and 5.

The acidic aqueous silver salt solution was slowly added to the acidic reducing and particle modifier solution over a period of one hour to form a reaction mixture that was intensely stirred during the addition. The reaction mixture was maintained at 25° C. Silver particles precipitated and were contained within the final aqueous solution. The final aqueous solution was then heated to 70° C. for one hour and stirring continued during the heating.

The silver particles were recovered as described in Example 1.

Figure 2:
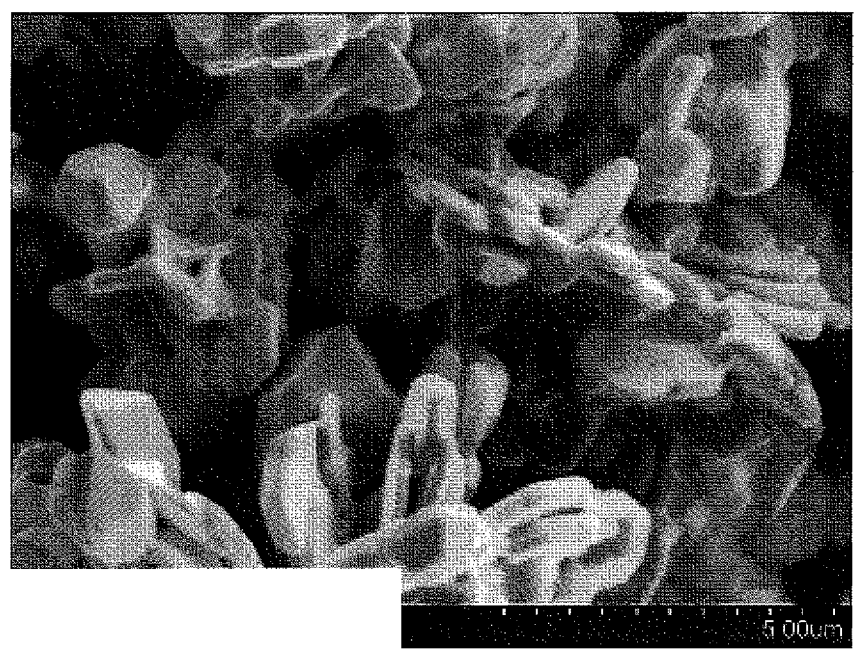
FIG. 2 is a scanning electron microscope image at a magnification of 10,000 of the silver powder particles made in the Comparative Experiment. The $d_{50}$ particle size is 8.7 µm.

As shown in the scanning electron microscope image of FIG. 2, the silver powder was comprised of very irregular-shaped relatively large silver particles. The size L of the crystallites in the particles was 47.6 nm. $d_{10}$, $d_{50}$, and $d_{90}$ were 5.4 µm, 8.7 µm and 14.0 µm, respectively. The TMA =−7.5%

What is claimed is:

1. A process for making silver powder particles, said process comprising:
    (a) preparing an acidic aqueous silver salt solution comprising a water soluble silver salt dissolved in deionized water;
    (b) preparing an acidic aqueous reducing and particle modifier solution comprising:
        (i) a reducing agent selected from the group consisting of ascorbic acid, ascorbates and mixtures thereof;
        (ii) nitric acid;
        (iii) maleic acid; and
        (iv) deionized water, wherein the pH of said acidic aqueous reducing and particle modifier solution is adjusted by the addition of a base to between 2.5 and 6;
    (c) maintaining said acidic aqueous silver salt solution and said acidic reducing and surface morphology modifier solution at the same temperature, wherein said temperature is in the range of 10° C. to 65° C., while stirring each said solution during and after preparation;
    (d) adding said acidic aqueous silver salt solution to said acidic aqueous reducing and particle modifier solution while stirring to make a reaction mixture and maintaining the temperature of said reaction mixture at said temperature of (c), wherein said silver powder particles precipitate and are contained within the resulting final aqueous solution; and
    (e) increasing the temperature of said final aqueous solution to a temperature in the range of 65° C. to 80° C. while continuing stirring;

one or both of said acidic aqueous silver salt solution and said acidic aqueous reducing and particle modifier solution further comprising gum arabic and said silver powder particles comprising crystallites of size less than or equal to 32 nm as determined by X-ray diffraction and the Scherrer formula; and said silver powder particles having a $d_{50}$ in the range of 0.5 to 3.5 μm.

2. The process of claim 1, further comprising:
    (f) separating said silver powder particles from said final aqueous solution;
    (g) washing said silver powder particles with deionized water; and
    (h) drying said silver powder particles.

3. The process of claim 1, wherein said base used to adjust the pH of said acidic aqueous reducing and particle modifier solution is NaOH.

4. The process of claim 1, wherein said water soluble silver salt is silver nitrate and said reducing agent is ascorbic acid.

5. The process of claim 1, wherein said pH of said acidic aqueous reducing and particle modifier solution is adjusted to between 3 and 5.

6. The process of claim 5, wherein said pH of said acidic aqueous reducing and particle modifier solution is adjusted to 4.

7. The process of claim 1, said acidic aqueous reducing and particle modifier solution further comprising a metal colloid selected from the group consisting of gold colloid and silver colloid.

8. The process of claim 7, wherein said metal colloid is gold colloid.

9. The process of claim 1, wherein the temperature in step (c) is in the range of 10° C. to 35° C. and the temperature in step (e) is in the range of 65° C. to 75° C.

10. The process of claim 9, wherein the temperature in step (c) is 25° C. and the temperature in step (e) is 70° C.

11. The process of claim 1, wherein said silver powder particles have a size distribution such that $(d_{90}-d_{10})/d_{50}<2.2$.

12. The process of claim 1, wherein said silver powder particles have a solids content in excess of 99% as determined by thermogravimetric analysis.

13. The process of claim 1, wherein said silver powder particles have a TMA shrinkage of at least -10%.

14. The process of claim 1, wherein said crystallites are less than or equal to 30 nm in size.

* * * * *